United States Patent
Yoshida et al.

(10) Patent No.: US 6,389,049 B2
(45) Date of Patent: *May 14, 2002

(54) DISCHARGE CIRCUIT FOR PULSED LASER AND PULSED POWER SOURCE

(75) Inventors: Daisuke Yoshida, Hadano; Toshihiro Nishisaka, Hiratsuka; Yuichi Takabayashi, Oyama; Takashi Matsunaga, Kanagawa; Hisashi Yanase; Tadao Shibuya, both of Numazu; Yasuo Kataoka, Yokohama; Masayuki Tani; Eiji Sasamoto, both of Numazu; Hiroyuki Hiyoshi, Shizuoka; Kiyoshi Hara, Numazu, all of (JP)

(73) Assignees: Komatsu Ltd.; Kabushiki Kaisha Meidensha, both of Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,681

(22) Filed: Oct. 5, 1998

(30) Foreign Application Priority Data

Oct. 3, 1997 (JP) .................................. 9-271207
Mar. 6, 1998 (JP) ............................... 10-054057

(51) Int. Cl.$^7$ ................................... H01S 3/10
(52) U.S. Cl. ........................ 372/38.02; 372/38.07; 372/55
(58) Field of Search .................. 372/55, 38.02, 372/38.03, 38.07, 38.1, 38.05

(56) References Cited

U.S. PATENT DOCUMENTS

| | | | | |
|---|---|---|---|---|
| 3,815,994 A | * | 6/1974 | Peckham | 356/4 |
| 4,105,952 A | * | 8/1978 | Tulip | 331/94.5 |
| 4,245,194 A | * | 1/1981 | Fahlen | 331/94.5 D |
| 4,644,549 A | * | 2/1987 | Oishi | 372/38 |
| 4,890,294 A | * | 12/1989 | Nishimae | 372/57 |
| 4,953,174 A | * | 8/1990 | Eldridge | 372/87 |
| 5,105,097 A | * | 4/1992 | Rothe | 307/108 |
| 5,267,253 A | * | 11/1993 | Nakatani | 372/38 |
| 5,369,655 A | * | 11/1994 | Miyamoto | 372/29 |
| 5,684,814 A | * | 11/1997 | Hollins | 372/38 |
| 5,754,579 A | * | 5/1998 | Mizoguchi | 372/58 |

FOREIGN PATENT DOCUMENTS

JP      4324985      4/1991

* cited by examiner

Primary Examiner—James W. Davie
Assistant Examiner—Gioacchino Inzirillo
(74) Attorney, Agent, or Firm—Diller, Ramik & Wight

(57) ABSTRACT

A discharge circuit for pulsed laser comprising a power source, main discharge electrodes for generating a laser beam, a main discharge capacitor charged with electrical charges for generating the main discharge between the main discharge electrodes, and a switching circuit for performing switching operations to charge the main discharge capacitor with electrical charges supplied from the power source in a prescribed repetition cycle, is provided, in parallel to the main discharge capacitors, with a circuit element for consuming or grounding the reverse current from the power source caused by overshoot generated directly after the main discharge, thereby attaining stable laser output without ill effects from overshoot voltage generated directly following discharge.

3 Claims, 10 Drawing Sheets

DISCHARGE CIRCUIT FOR PULSED LASER AND PULSED POWER SOURCE

BACKGROUND OF THE INVENTION

1. Field of the Invention

The present invention relates to an improvement to the discharge circuit for a pulsed laser, for effecting pulsed laser oscillation by pulsed discharge at a prescribed repetition cycle so as to excite a laser medium, wherein variations in laser output caused by overshoot current at the time of discharge are eliminated.

Also, the present invention relates to a pulsed power source apparatus in which a pulse generating circuit using a power semiconductor switch is combined with a magnetic pulse compressor circuit, for generating pulses of large current with narrow width at a rapid repetition rate, and more particularly, to a pulsed power source apparatus which eliminates unstable load operations caused by energy not consumed by a load when pulsed current is supplied to the load, and which ensures magnetic resetting of the pulse transformer.

2. Description of the Related Art

"TEA laser" refers to a laser generated by a method in which laser oscillation is effected by applying electrical discharge to a gas at a pressure of one atmosphere or higher. In the TEA laser, a uniform glow discharge is generated between a pair of mutually opposite main discharge electrodes to form an inverted population area necessary for laser oscillation. In order to attain a glow discharge spread throughout the entire discharge space, it is necessary to perform preionization before the start of the main discharge and to ionize the entire main discharge space in advance. For an excimer laser in particular, it is necessary to have as much ionization as possible directly before the main discharge, because of the short life of electrons in the ionized gas.

Currently, such preionization is achieved by various methods such as using X-rays, spark discharge, corona discharge and the like. OF these methods, a method using corona discharge has been widely used because it is relatively simple and does not greatly contaminate the laser gas.

FIG. 10 shows an equivalent circuit of a conventional capacitor-transfer type magnetic pulse compression discharge apparatus for effecting preionization using corona discharge.

In the discharge circuit in FIG. 10, a corona preionization electrode 4 is placed at a side of a main discharge space 3 formed between a pair of main electrodes 1, 2. Preionization of the laser medium in this main discharge space between the main electrodes 1, 2 is brought about with UV light generated by corona discharge by the corona preionization electrode 4.

In this configuration, a capacitor C0, connected to a high voltage power source HV, is charged with electrical charge from the power source HV.

Next, when a switching circuit SW, comprising a thyratron, GTO or the like, is turned ON, current I00 flows into a magnetic switch SI1, comprising the capacitor C0, switching circuit SW, capacitor C1 and saturable reactor. After that, when the voltage in the capacitor C1 rises to a prescribed voltage, the magnetic switch SI2 becomes saturated and enters a low impedance state.

As a result, current I01 flows through a loop formed by the capacitor C1, main discharge capacitor Cp and magnetic switch SI2, and the voltage in the capacitors Cp, Cb rises.

Afterwards, the voltage at the corona preionization electrode 4 rises by means of the preionization capacitor Cb to a prescribed voltage at which preionization starts. At that time, corona discharge is generated in the corona preionization electrode, current I02 flows through the main discharge space 3, and preionization occurs in the main discharge space 3.

Afterwards, the voltage in the main discharge capacitor Cp rises as charging takes place. When this voltage reaches a prescribed voltage at which the main discharge begins, the main discharge starts between the main electrodes 1, 2 and current I03 flows. Then, the laser medium is excited by the main discharge generated between main electrodes 1, 2 and laser light is generated.

Then, the voltage of the capacitors Cp, Cb rapidly decreases as a result of the main discharge and, after a prescribed period of time, returns to the state before charging started.

Pulsed laser oscillation results from repeating such a discharge operation at a prescribed repetition cycle (pulse oscillation frequency) established in the switching circuit SW.

FIG. 11 shows the waveform of the voltage VD applied between the main electrodes 1, 2 for the cycle of one pulse.

As discussed above, the voltage VD increases (in this drawing, becomes more negative) with the charging of the main capacitor Cp. When this voltage VD reaches the prescribed voltage at which the main discharge starts, the main discharge is generated. The voltage VD rapidly drops after the main discharge is generated and at this time, overshoot voltage, with a polarity opposite to that of the discharge voltage, is generated due to a transient phenomenon. Then, directly before the return to a steady state, a voltage Vd (shaded portion) is generated. This voltage Vd is thought to be a voltage reflected from the power source HV of the aforementioned overshoot voltage.

In other words, because the magnetic switches SI1, SI2 are in a low impedance state after discharge, the overshoot current generated directly after discharge passes through magnetic switches SI1, SI2 and flows to the power source HV, where the reflected voltage Vd is generated as a result of the reflected reverse current Id (dashed line in FIG. 10) flowing into the main discharge capacitor Cp. The main discharge becomes unstable due to this reflected voltage Vd and causes variations in laser output.

Further, a part Id' of the reverse current Id flows into the preionization capacitor Cb. As a result, the preionization discharge becomes unstable, causing the preionization to become unstable and resulting in variations in laser output.

The phenomenon of the reflected voltage Vd is explained in more detail referring to FIGS. 12–14.

FIG. 12 shows an example of a conventional pulsed power source apparatus. In FIG. 12, a first-stage capacitor C0 for power is provided in a pulse generating circuit 21. This capacitor C0 is initially charged by means of a high voltage charger 22 and, as a semiconductor switch SW is turned on, supplies pulsed current I0 from the capacitor C0, via a reactor L0, to a pulse transformer PT.

A magnetic reset circuit MR1 prevents magnetic saturation of the iron core of the pulse transformed PT by supplying DC bias current to the reset coil of the pulse transformer PT.

Two magnetic pulse compressor circuits 231, 232 are connected in a cascade arrangement on the secondary side of the pulse transformer PT. In the first magnetic pulse compressor circuit 231, the pulsed current I1 whose voltage is raised by the pulse transformer PT, effects high voltage charging of the capacitor C1. This charged voltage in the capacitor C1 actuates a saturable reactor SI1 operating as a magnetic switch so that a narrow-width pulsed current I2, having undergone magnetic pulse compression, is supplied in the polarity shown in the drawing to the next magnetic pulse compressor circuit 232. In the same way, as a result of the saturable reactor SI2 operating a magnetic switch, the magnetic pulse compression of the pulse width is carried out by the magnetic pulse compressor circuit 232 and the pulsed current I3 is output with the polarity shown in the drawing.

Meanwhile, magnetic reset coils and magnetic reset circuits MR2 and MR3 are provided in saturable reactors SI1 and SI2, respectively. These are excited and saturated with the reverse polarity by the supply of a direct current after saturation of the saturable reactors SI1, SI2.

The pulse output of the magnetic pulse compressor circuit 232 supplies narrow width, high voltage pulsed current to a load 24 such as a laser head chamber. In the load 24, a peaking capacitor Cp is provided in parallel with the circuit of main discharge electrodes 1, 2 and preionization electrode 4. When the peaking capacitor Cp is charged to a certain voltage level with the pulsed current, gas in the laser tube is preionized with the discharge of the preionization electrode 4 via the capacitor Cb and the main discharge between the main discharge electrodes 1, 2 is attained with this preionization.

The aforementioned configuration shows the case where the magnetic pulse compressor circuits are provided in two stages. However, N-stage structure is also possible. FIG. 13 shows the waveform of the charging voltage VCO–VCN, Vcp of the capacitors C0, C1–CN and the peaking capacitor Cp in an N stage structure. Due to magnetic pulse compression, the charging time T1-Tp undergoes greater magnetic pulse as the stage of capacitors is later so that a narrow-width discharge current is supplied to the main discharge electrodes 1, 2 of the load 24.

In a pulsed power source apparatus with such a structure, the discharge in the load 24 does not consume all the pulse energy provided. Instead, part of the unconsumed energy is returned to the pulse generating circuit 21. This returned energy is called "kickback energy". This kickback energy appears as a reflected energy from the pulse generating circuit 21, in the form of recharge voltage (residual charge) for the peaking capacitor Cp after the discharge in the load.

In regards to the voltage waveform of the peaking capacitor Cp, the amount of recharge voltage varies widely depending on the state of the gas filled in the discharge tube at the time of discharge in the load 24. Therefore, when the load 24 is a laser head, the output energy may become unstable.

FIG. 14 shows an example of the voltage waveform in the peaking capacitor Cp. In this figure, the peaking capacitor Cp is discharged rapidly through the main electrodes 1, 2 following the charging period (t0–t1). Then, the capacitor Cp is recharged by the kickback energy during the recovery period (t2–t3) for recovery from discharge by the main electrodes 1, 2. This residual charged energy, which changes according to the state of gas in the discharge tube of load 24, is supplied again to the pulse generating circuit 21.

During the recovery of the discharge in the load, the voltage change of the peaking capacitor Cp takes the form of a waveform A1 or waveform B1 in FIG. 14. The waveform A1 shows the case where voltage of the peaking capacitor Cp quickly recovers to the initial state while Its positive polarity being unchanged. The waveform B1 shows the case where the peaking capacitor Cp is recharged in reverse polarity and recovers to the initial state with delay.

In the recovery process of the waveform B1, the state within the chamber where the main discharge electrodes 1, 2 and the preionization electrode 4 are installed, are influenced so that, in the case where the load is the laser head, the operation of the load becomes unstable, causing such phenomenon that the output energy of the subsequent discharge becomes unstable.

SUMMARY OF THE INVENTION

In view of the foregoing, it is an object of the present invention to provide a discharge circuit for pulsed laser which can attain stable laser output, without negative effects caused by overshoot voltage directly after the main discharge in the discharge circuit.

It is another object of the present invention to provide a pulsed power source apparatus which prevents unstable operation of the load due to residual charge in the peaking capacitor and prevents magnetic deflection of the pulse transformer.

To achieve the above objects, the present invention provides a discharge circuit for pulsed laser comprising a power source; main discharge electrodes for generating a laser beam; a main discharge capacitor charged with electrical charges for generating the main discharge between the main discharge electrodes; and a switching circuit for performing switching operations to charge the main discharge capacitor with electrical charges supplied from the power source in a prescribed repetition cycle, characterized in that a circuit element for consuming or grounding the reverse current from the power source caused by overshoot generated directly after the main discharge, is provided parallel to the main discharge capacitor.

With such a configuration as described above, a resistor or a one-way circuit element such as a diode is connected parallel to the main discharge capacitor. Such a diode or resistor allows the reverse current from the power source, caused by the overshoot generated directly after discharge, to be grounded or to be consumed as heat. As a result, it is possible to eliminate the reflected voltage from the power source which is a reflection of the overshoot voltage. Thus, stable laser output can be attained.

Further, the present invention provides a discharge circuit for pulsed laser comprising a power source; main discharge electrodes for generating a laser beam; a main discharge capacitor charged with electrical charges for generating main discharge between the main discharge electrodes; a preionization electrode for preionizing a space between the main discharge electrodes; a preliminary discharge capacitor charged with electrical charges for generating the preliminary discharge at the preionization electrode; and a switching circuit for performing switching operations to charge the main discharge capacitor and preionization capacitor with electrical charges from the power source in a prescribed repetition cycle, characterized in that a one-way circuit element is provided in a direction opposite to the direction in which the reverse current flows from the power source caused by overshoot generated directly after the main discharge, and serially to the preionization electrode.

With such a configuration as described above, a one-way circuit element such as a diode, arrange in the reverse direction to the reverse current, is connected serially to the preionization electrodes. This can prevent the reverse current from flowing to the preionization electrodes; the preliminary discharge is thereby made stable and it becomes possible to attain uniform preionization.

Another aspect of the present invention provides a pulsed power source apparatus comprising a pulse generating circuit for generating pulsed current from an initially charged capacitor via a pulse transformer as controlled by the semiconductor switch and a magnetic pulse compressor circuit for performing magnetic pulse compression on the pulsed current attained on a secondary side of the pulse transformer by means of a magnetic switch operation of a saturable reactor, and supplying the pulsed current thus compressed to a load having main discharge electrodes and a peaking capacitor connected parallel to the main discharge electrodes, characterized in that a series circuit of a diode and a Zener diode is provided in a parallel connection to the peaking capacitor of the load; the diode being oriented to prevent the peaking capacitor from being recharged in the opposite polarity after being charged during discharge recovery of the main discharge electrodes; and the zener diode having Zener voltage for generating clamp voltage to prevent the secondary side of the pulse transformer from entering a short circuit state in response to the application of magnetic reset voltage for putting the pulse transformer in an unsaturated state.

In the above configuration, the diode and Zener diode series circuit is provided parallel to the peaking capacitor of the load, thereby to block the recharge voltage of the peaking capacitor with the conduction of the diode and eliminate unstable operation of the load, while ensuring magnetic reset of the pulse transformer by generating clamp voltage on the secondary side of the pulse transformer with the Zener voltage generated by the Zener diode. Moreover, the saturation and magnetic deflection of the pulse transformer can be prevented. In other words, the parallel installation of a diode circuit for preventing the peaking capacitor from being recharged with the reverse polarity after the peaking capacitor is recharged with the discharge recovery of the main discharge electrodes of the load, can eliminate the phenomenon of instability of the load due to the recharging of the peaking capacitor, and can ensure magnetic reset of the pulse transformer after discharge and prevent the magnetic deflection and saturation thereof, because it generates the clamp voltage necessary for magnetic reset of the saturable reactor of the magnetic pulse compressor circuit with the Zener diode.

DESCRIPTION OF THE PREFERRED EMBODIMENTS

Below, embodiments of the present invention are explained in detail with reference to the attached drawings.

Figure 1:
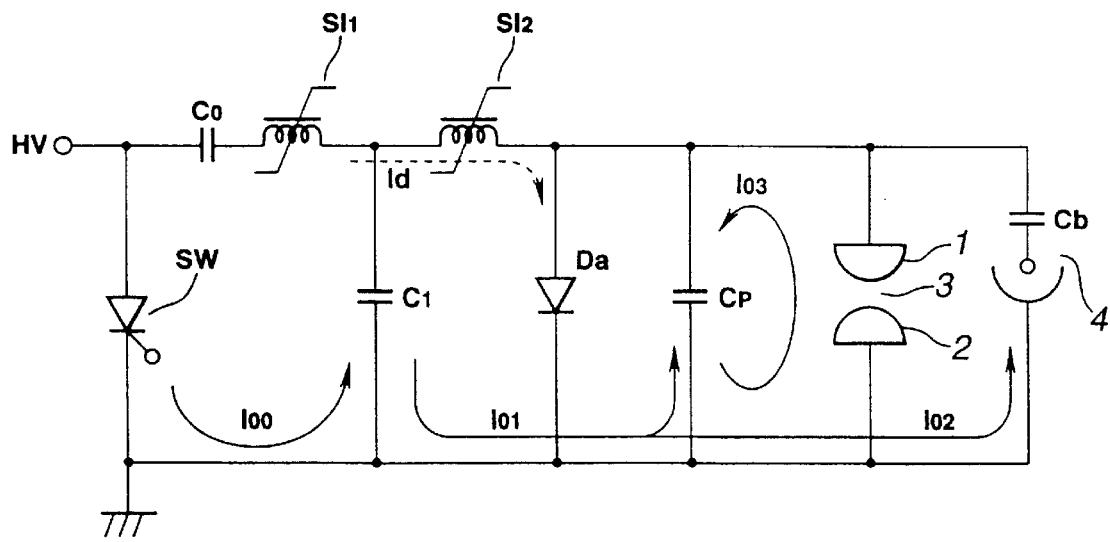
FIG. 1 is a circuit diagram showing an embodiment of the present invention.

FIG. 1 is an equivalent circuit of an embodiment of the discharge circuit for pulsed laser according to the present invention which is applied to a capacitor-transfer type magnetic pulse compression discharge apparatus.

Figure 10:
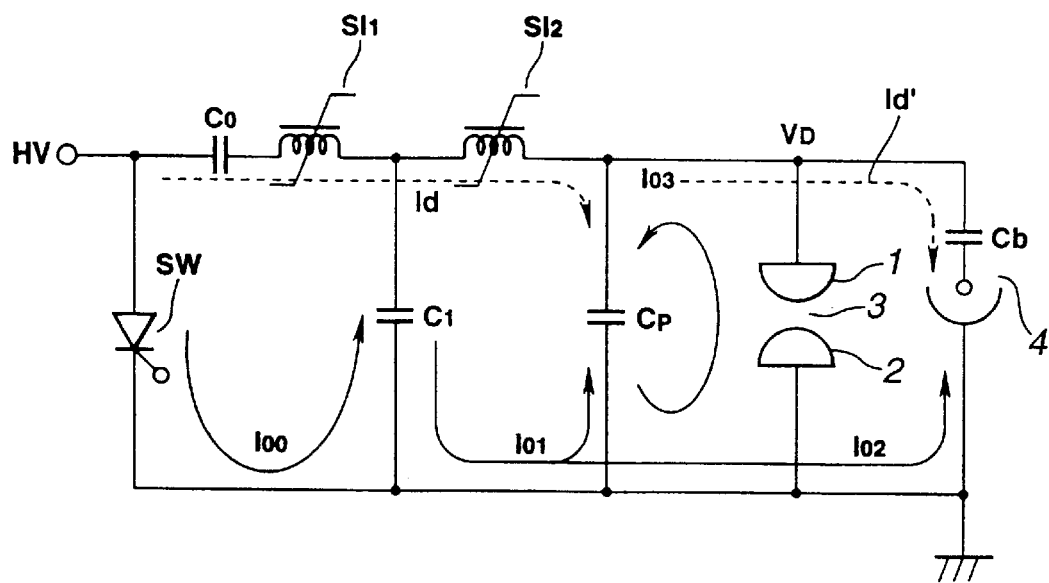
FIG. 10 is a circuit diagram of a conventional discharge circuit.
Figure 11:
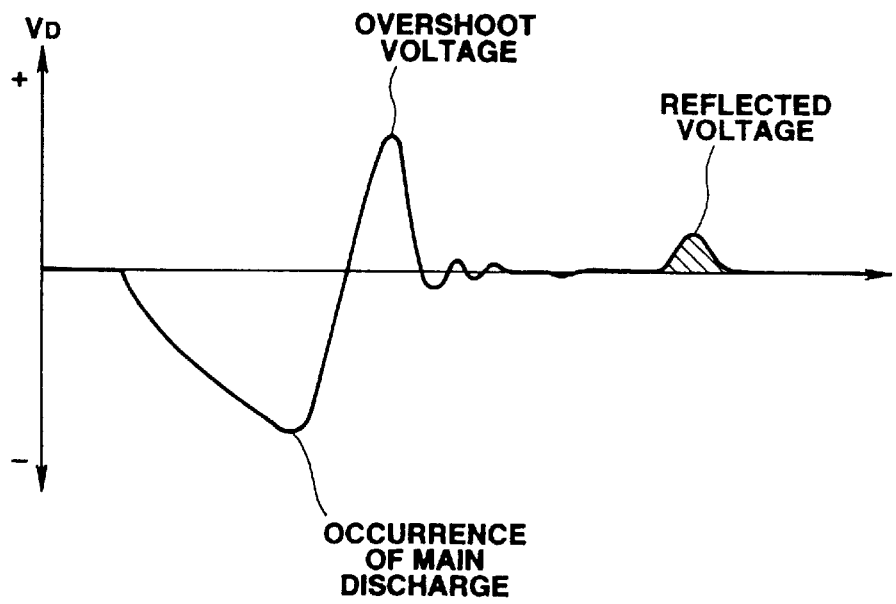
FIG. 11 is a time chart for explaining the operation of the conventional discharge circuit.

In the embodiment shown in FIG. 1, a diode Da is added to the conventional circuit shown in FIG. 10; otherwise the configuration is the same as the conventional circuit in FIG. 10.

Specifically, in the present embodiment, the diode Da connected to the ground and parallel to the main discharge capacitor (peaking capacitor) Cp is provided in forward direction relative to the direction of the reverse current Id which flows from the power source HV. With this capacitor Cp, the reverse current Id is rapidly released to the ground so that the reflected voltage Vd is not generated.

Figure 2:
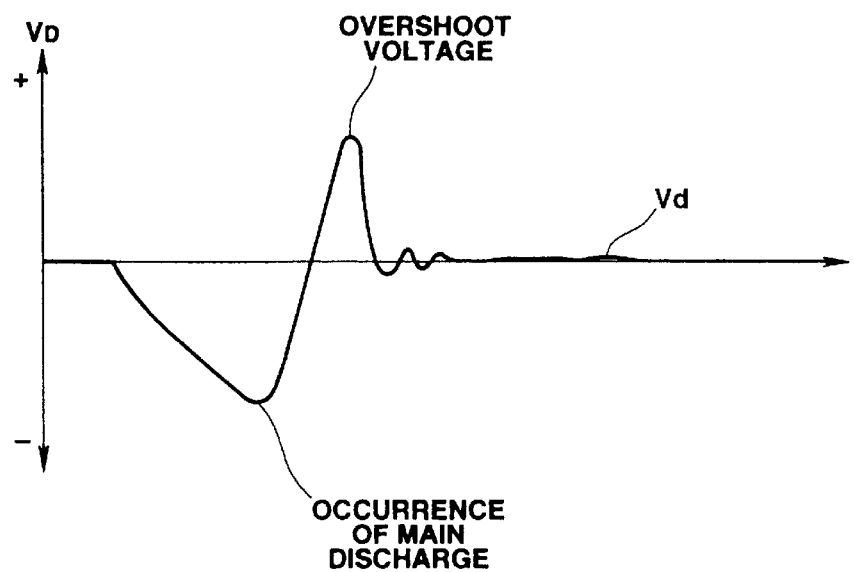
FIG. 2 is a time chart for explaining the operation of the embodiment in FIG. 1.

FIG. 2 shows the waveform of the voltage VD applied between the main electrodes 1, 2 in the embodiment in FIG. 1. As clear from this figure, the present embodiment generates almost no reflected voltage Vd, which is generated in the conventional discharge circuit. As a result, the variations in laser output that occurred in the conventional circuit can be greatly decreased.

Figure 3:
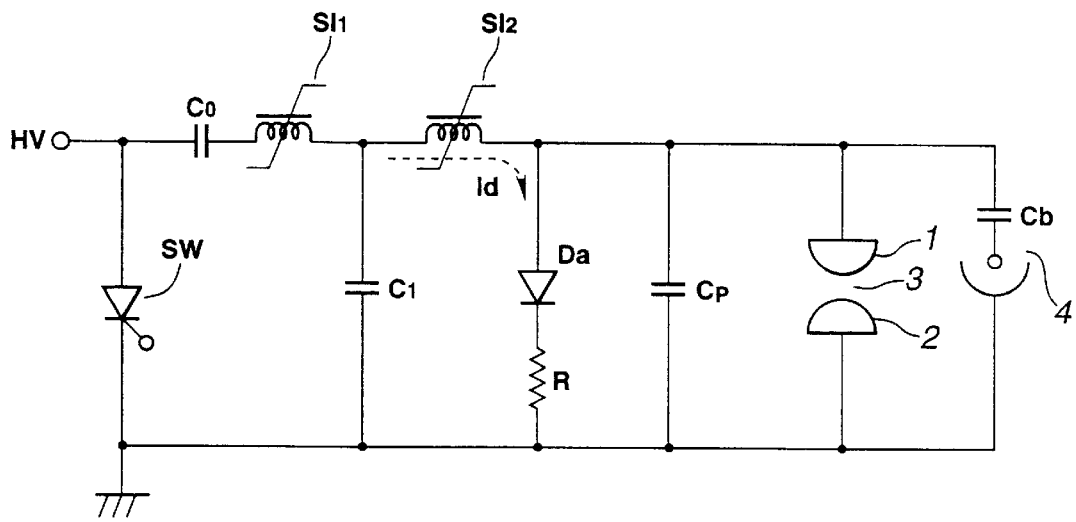
FIG. 3 is a circuit diagram showing another embodiment of the present invention.
Figure 4:
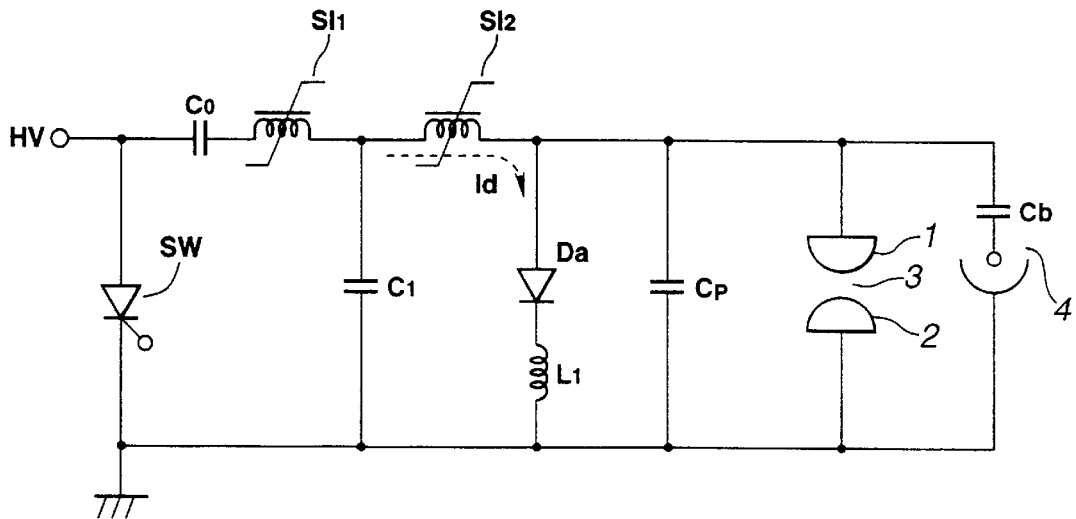
FIG. 4 is a circuit diagram showing still another embodiment of the present invention.
Figure 5A:
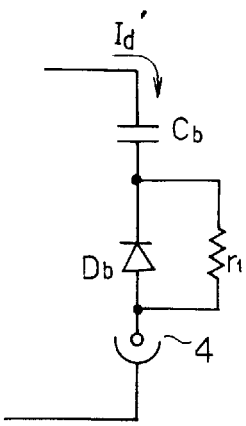
FIGS. 5(a) through 5(j) are circuit diagrams showing yet another embodiments of the present invention.
Figure 5B:
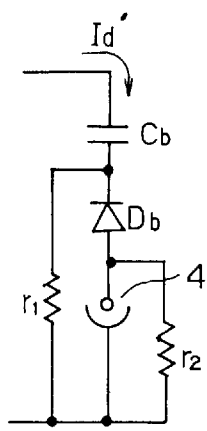
Figure 5C:
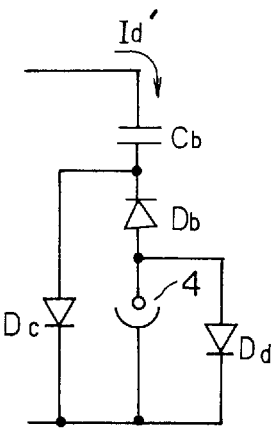
Figure 5D:
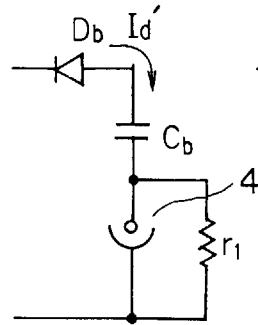
Figure 5E:
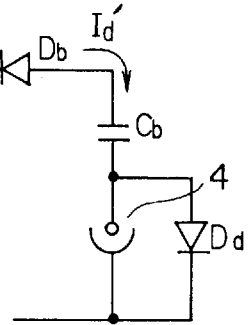
Figure 5F:
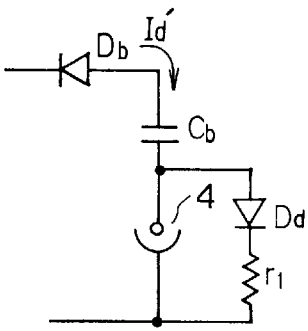
Figure 5G:
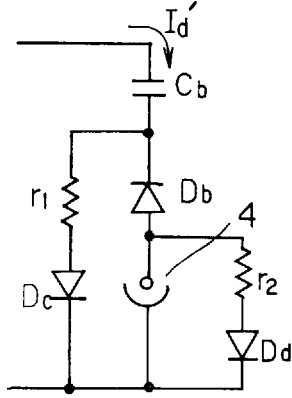
Figure 5H:
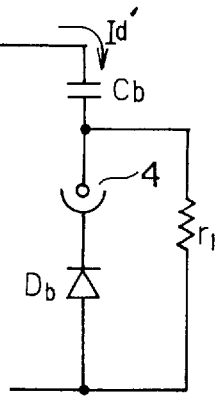
Figure 5I:
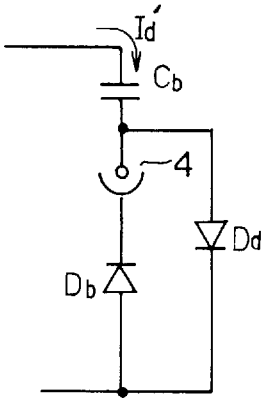
Figure 5J:
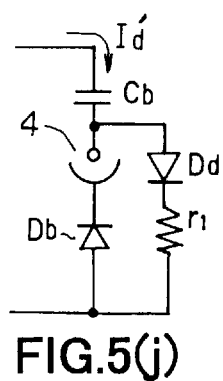

FIGS. 3 and 4 show another embodiments of the present invention. In these embodiments, a resistor R1 or coil L1 is connected serially with the diode Da in the first embodiment. In these embodiments as well, the same effects can be attained as with the first embodiment. The resistor R1 guides the reverse current Id to the ground while serving to consume the electric current as heat.

Moreover, a resistor only or a coil only may be connected instead of the diode Da in the embodiment in FIG. 1.

FIGS. 5(a)–5(j) show still another embodiments of the present invention. In order to prevent a portion Id' of the reverse current Id from flowing into the preionization electrode 4, these embodiments are provided with a diode Db in the direction opposite to the direction of the reverse current Id'.

In other words, the reverse current Id' flowing toward the preionization capacitor Cb has the negative effect of destabilizing the preliminary discharge. In the embodiments in FIGS. 5(a)–5(j), the diode Db is provided in the reverse direction to the reverse current Id' and does not let the reverse current Id' flow to the corona preionization electrodes.

Also, in the embodiments in FIGS. 5(a)–5(j), the diodes Dc, Dd and resistors r1, r2 are provided in order to rapidly dispel electric charges remaining in the preliminary discharge capacitor Cb. The charge remaining in the preliminary discharge capacitor Cb is grounded through the diodes Dc, Dd and resistors r1, r2 or consumed as heat in the resistor r1 or r2.

In this way, in the embodiments shown in FIGS. 5(a)–5(j), the diode Db blocks the reverse current Id' flowing from the power source caused by overshoot, while the diodes Dc, Dd and resistors r1, r2 serve to discharge electric charges remaining in the preliminary discharge capacitor Cb. As a result, electric charges are prevented from remaining in the preionization electrodes. This makes it possible to suppress the instability of the preionization which is caused by the fluctuation of the preionization discharge. Thus, variations in laser output can be prevented.

Figure 6:
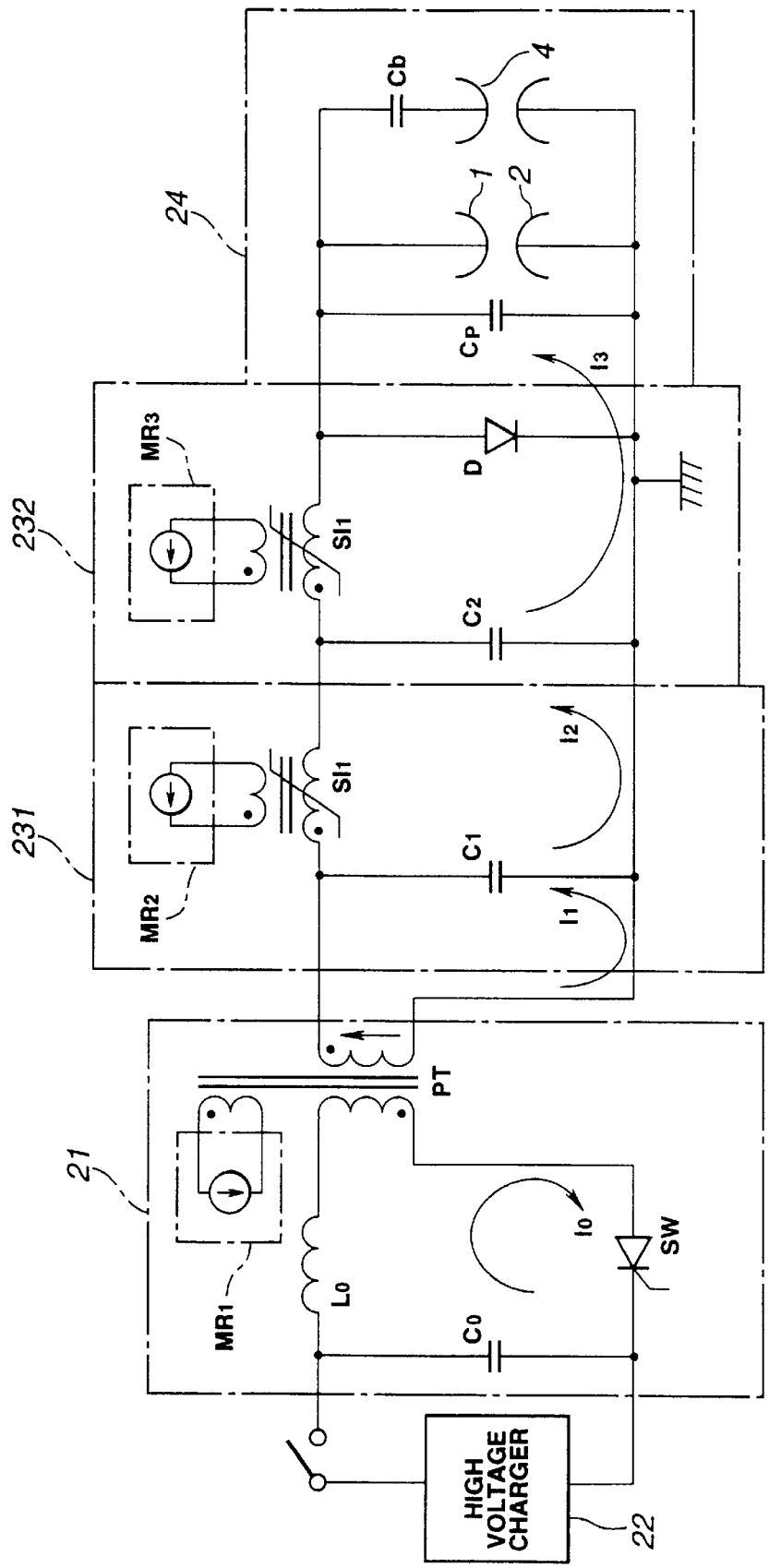
FIG. 6 is a block diagram showing another embodiment of the present invention.
Figure 12:
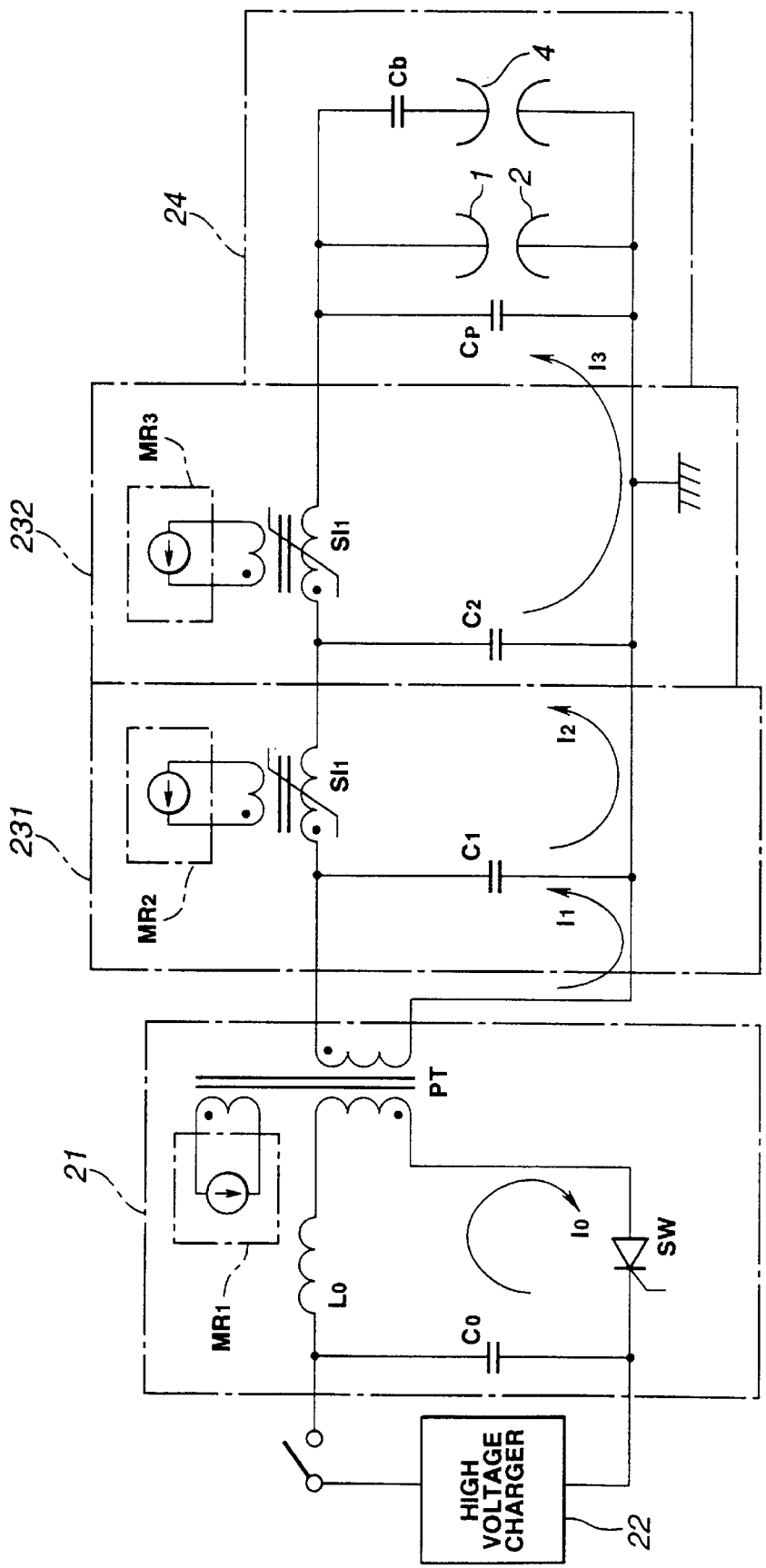
FIG. 12 is a block diagram showing the background art.
Figure 13:
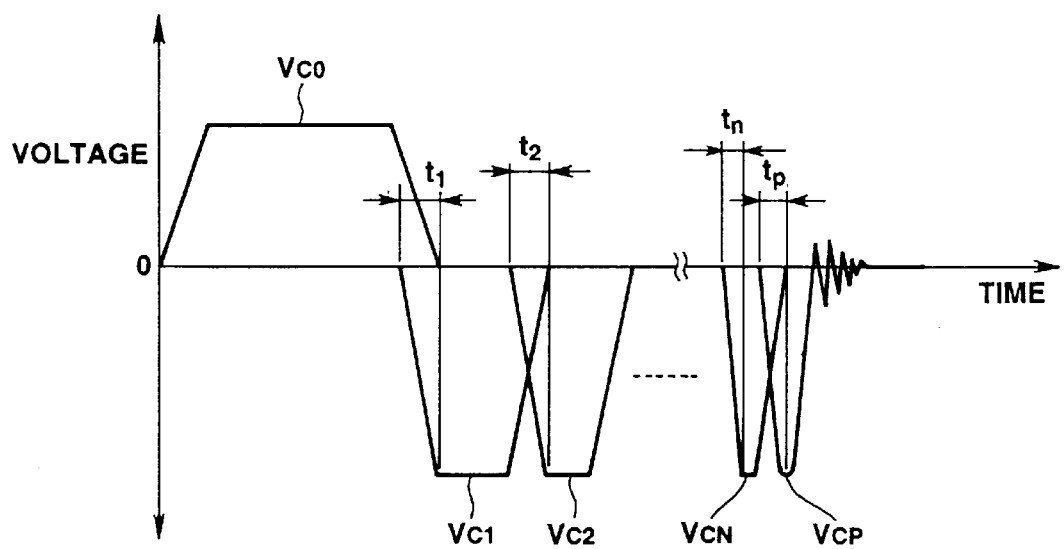
FIG. 13 is an example of the voltage waveform of each capacitor in a conventional circuit.
Figure 14:
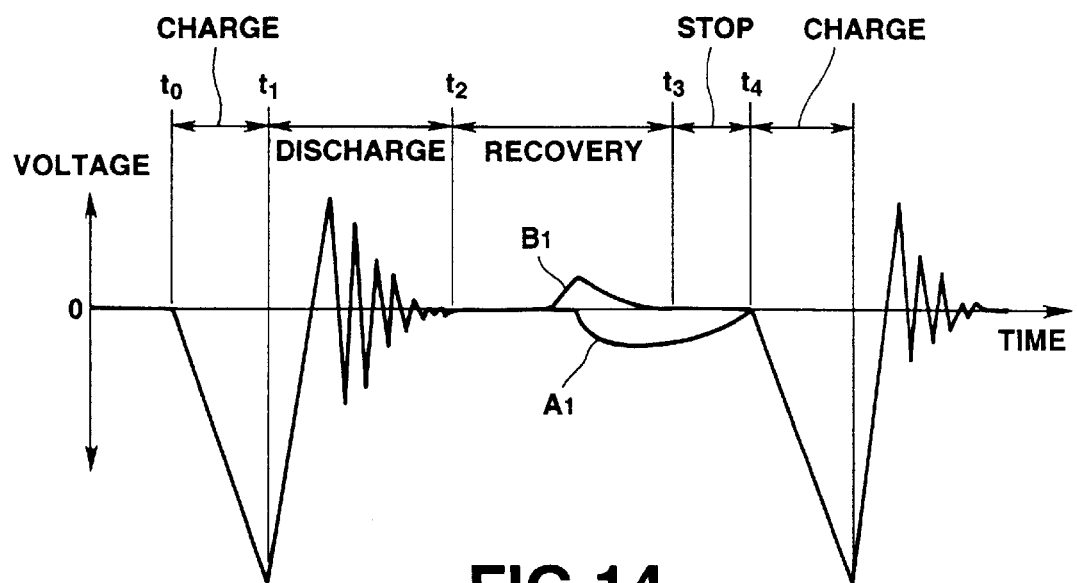
FIG. 14 is an example of the voltage waveform of the peaking capacitor Cp of the conventional circuit in FIG. 12.

Next, FIG. 6 shows another embodiment of the present invention. FIG. 6 is the same as the conventional circuit shown in FIG. 12 except that a diode D is provided parallel to the main discharge electrodes 1, 2. With this diode D, the residual charge of the peaking capacitor Cp is reduced and unstable operation of laser output is prevented, like in the embodiment in FIG. 1.

In the structure of FIG. 6, the magnetic reset circuits MR1, MR2, and MR3 are shown as constant current sources. Actually, the constant current source is realized with a serial arrangement of resistor and inductor in the DC constant voltage source. The dot symbol shown in the coils of the saturable reactors SI1, SI2 and the pulse transformer PT shows coil orientation. The polarity of the voltage induced becomes the direction shown with the dot symbols. The dot symbols are shown when the positive polarity voltage is applied to the reset coils of the magnetic reset circuits MR1, MR2, and MR3.

In order to reset the magnetic substances of the pulse transformers and saturable reactors in one direction, it is necessary to pass through an unsaturated region, as clear from the B-H curve of the magnetic substances. In this unsaturated region, a transformer action occurs between the primary coil and secondary coil as well as the main coil and the reset coil of the pulse transformer. When reset voltage is applied to the reset coil, an induced voltage is applied to the main coil. Conversely, when the main coil is in a low impedance state, the voltage induced by the main coil does not rise and the time to reset becomes long.

The saturation in the pulse transformer PT and saturable reactors SI1, SI2 in FIG. 6 is determined by the voltage time product (Vt) which is the product of applied voltage and time during which the voltage is applied. By the magnetic pulse compression, pulses become narrower as the pulse compression stages become later, the voltage time products Vt of the pulse transformer PT and saturable reactors SI1, SI2 have the following relationship.

$$VtPT > VtSI1 > VtSI2$$

Consequently, when the respective reset circuits MR1, MR2 and MR3 of the pulse transformer PT and saturable reactors SI1, SI2 have equivalent abilities, or when reset current is supplied from one reset power source to each reset coil, the times required to reset (Treset) for these have the same type of relationship as the above relationship.

$$TresetPT > TresetSI1 > TresetSI2$$

As a result, the pulse transformer PT is reset after resetting of the saturable reactors SI1, SI2 is complete. In effect, even after the saturable reactor SI1, SI2 are reset and enter a low impedance state (nearly short-circuited state), in order for the pulse transformer PT to be reset, it is necessary to keep applying the voltage of the polarity shown in FIG. 6 for a given time.

For the application of reset voltage to the pulse transformer PT, the polarity of the voltage at the secondary coil is oriented as shown with the dot. For this polarity, the diode D or the series circuit of the diode D and resistor R, for eliminating the residual charge of the peaking capacitor CP, is in conductive direction. In other words, the provision of the diode D has the following effects. With the application of reset voltage to the pulse transformer PT, the secondary side of the pulse transformer is nearly short-circuited by the diode D and cannot establish the reset voltage.

Meanwhile, the pulse transformer PT performs transformer operation in an unsaturated state, unlike the saturable reactors SI1, SI2. The current and pulsed voltage caused by the kickback energy from the peaking capacitor Cp have quantities which are markedly smaller than the quantities of the current and pulsed voltage applied by the discharge from the capacitor C0 even though the polarities are opposite to each other.

For this reason, the pulse transformer PT supplies reset current with the magnetic reset circuit MR1 and tries to return it to an unsaturated state. However, the presence of the diode D on the secondary side results in insufficient resetting. As a result, the magnetic substance of the transformer is gradually magnetically deflected and becomes saturated after all.

In this way, by providing the diode D or series circuit of the diode D and resistor R parallel to the main electrodes 1, 2, residual charge of the peaking capacitor Cp can be eliminated and problem of unstable laser output can be solved. On the other hand, however, the presence of the diode D causes the problem of magnetic deflection of the pulse transformer PT.

Figure 7:
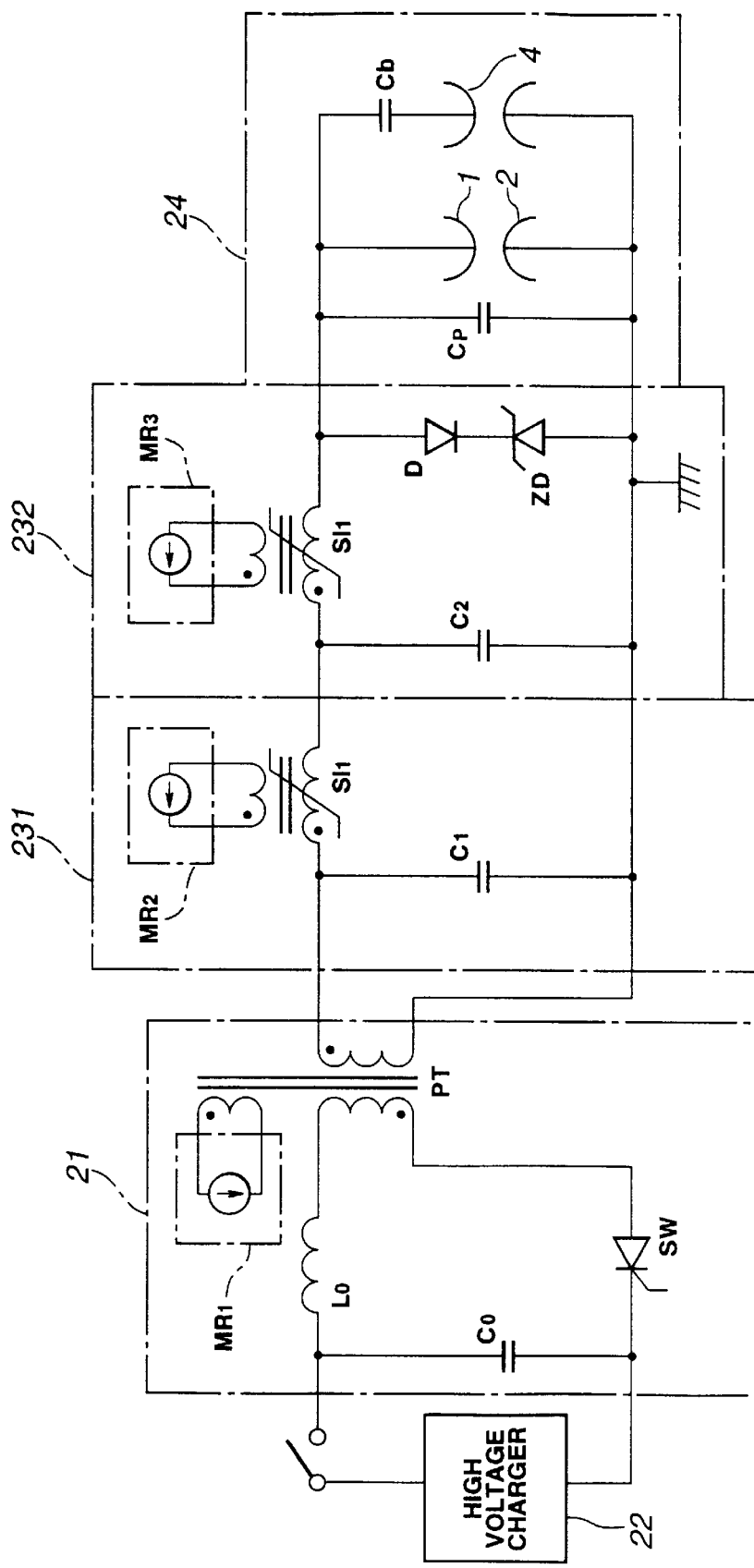
FIG. 7 is a block diagram showing still another embodiment of the present invention.

FIG. 7 shows an embodiment of the present invention for resolving such problem. FIG. 7 differs from FIG. 6 in regards to the diode circuit wherein a Zener diode DZ is provided serially to the diode D.

This diode circuit is connected in parallel to the peaking capacitor Cp. The polarity of the diode D is oriented to prevent the peaking capacitor Cp from being recharged with the reverse polarity after it is charged by the recovery of discharge between the main discharge circuits 1, 2. Specifically, when the peaking capacitor Cp is to be recharged with the reverse polarity, the diode D becomes conductive and grounds or consumes the reverse current.

The reverse blocking voltage of the diode D is determined to be greater than the voltage of the peaking capacitor Cp when it is charged by the pulsed current supplied to the load 24 from the final stage magnetic pulse compressor circuit 232.

The Zener diode ZD of the diode circuit generates Zener voltage for the forward current of the diode D. This Zener diode ZD generates, as Zener voltage, the clamp voltage necessary for magnetic reset of the pulse transformer PT.

Moreover, the connecting direction of the diode circuit is varied appropriately according to the polarity at which the peaking capacitor Cp is charged by the discharge of the load, depending on the structure of the load and the structure of the magnetic pulse compressor circuit.

With such a diode circuit being provided, peaking capacitor Cp is discharged after the discharge between the main discharge electrodes 1, 2. And recharging of the peaking capacitor Cp at the reverse polarity can be prevented by the conduction of the diode D, stabilize the subsequent discharge of the load 24, and eliminate the phenomenon of unstable output energy.

In addition, the diode circuit of the present embodiment includes the Zener diode ZD, which makes it possible to ensure magnetic resetting of the pulse transformer PT. This is explained in more detail below.

As noted above, with the application of magnetic reset voltage of the pulse transformer PT, the secondary side thereof is short circuited because of the presence of the diode D. For a pulsed current with a high rate of repetition, magnetic resetting becomes difficult after the generation of the pulsed current, which sometimes causes magnetic deflection.

The Zener diode ZD generates clamp voltage, and this clamp voltage can provide the induced voltage of the main coils necessary for resetting the pulse transformer PT. Thus, magnetic reset can be effected by obtaining a desired voltage time Product thereof.

If this clamp voltage is very high, the recharge voltage of the peaking capacitor Cp is not suppressed. Therefore, the diode circuit is appropriately designed by considering the forward voltage drop due to the serial diodes, characteristic of the load, etc.

Figure 8:
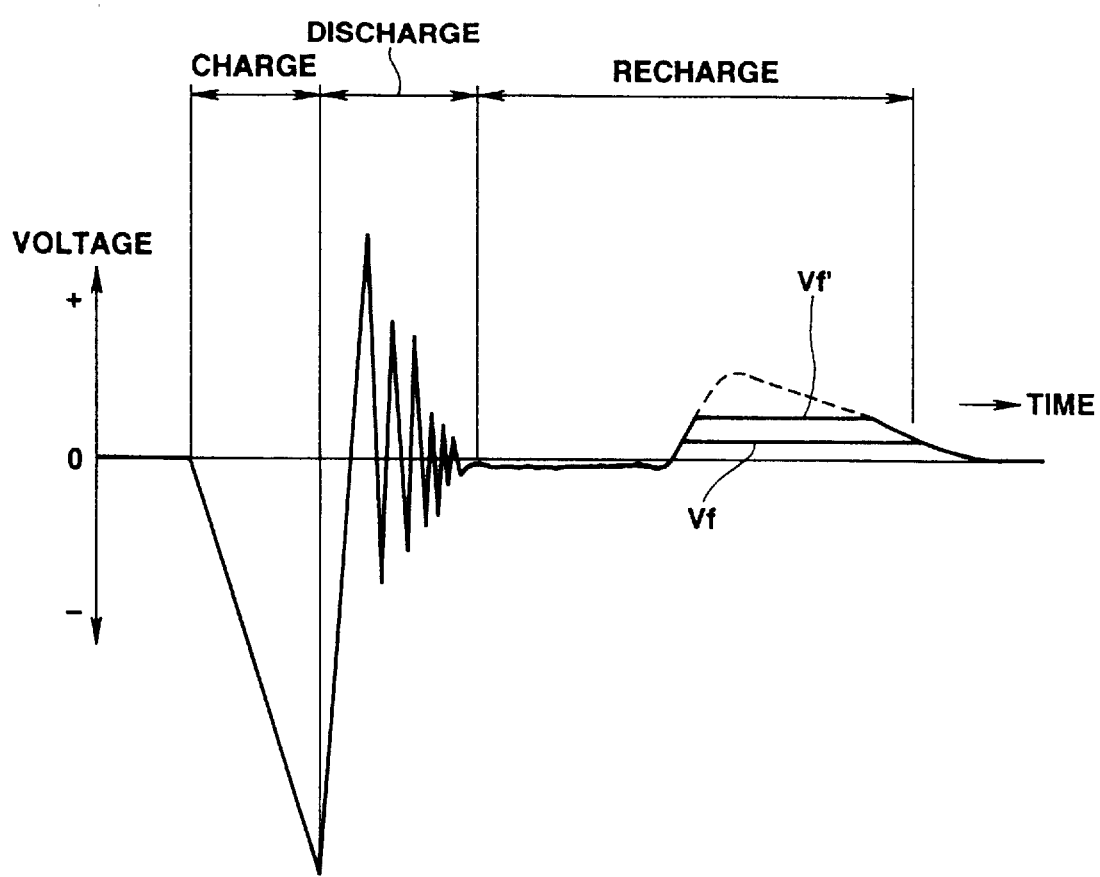
FIG. 8 is an example of the voltage waveform of the peaking capacitor Cp of the embodiment in FIG. 7.

FIG. 8 shows the effect of the diode circuit on the suppression of recharge voltage of the peaking capacitor Cp. By suppressing to the forward voltage Vf of the diode D, recharging of the peaking capacitor Cp with the reverse polarity during the recovery period is prevented, thereby to attain the stable operation of the load.

In addition, by suppressing recharge voltage with clamp voltage by the forward voltage Vf' in which the clamp voltage is added by the Zener diode ZD, stable operation of the load is attained. Moreover, this also ensures magnetic resetting of the pulse transformer PT by the magnetic reset circuit MR1.

Even in a serial circuit comprising a resistor R and diode D, the clamp voltage can be generated by the resistor R for the magnetic reset voltage which is applied to the pulse transformer PT.

With the clamp voltage generated by the resistor R, stable operation of the load 24 is attained. However, the stable magnetic reset operation for the pulse transformer PT becomes difficult because of the reasons stated below.

Figure 9:
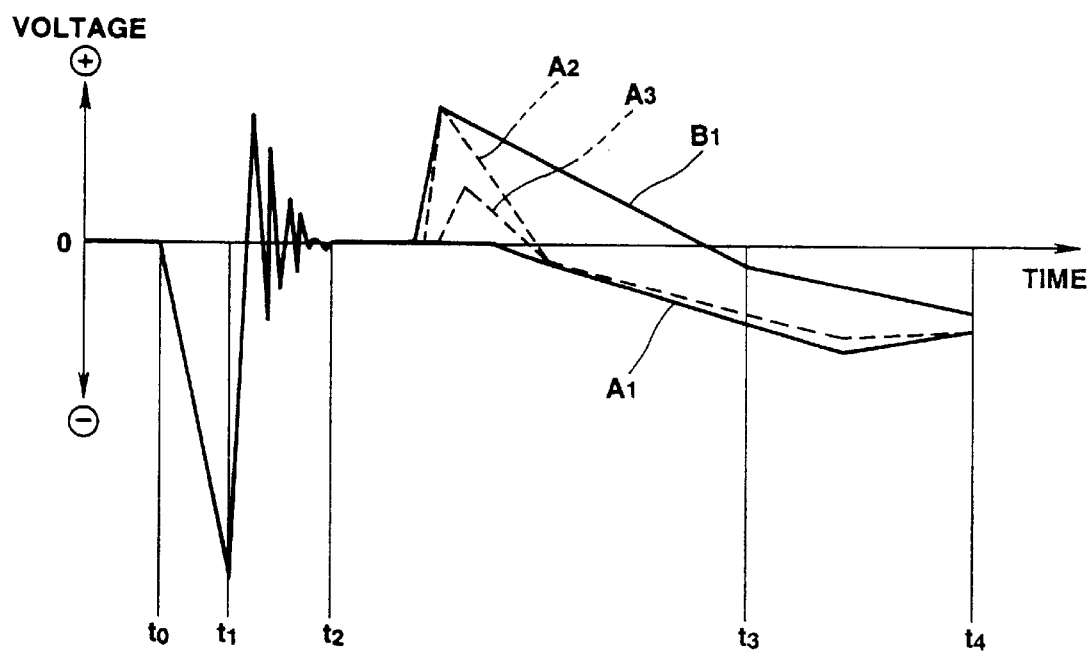
FIG. 9 is an example of the waveform of each type of voltage of the peaking capacitor Cp.

The inventors of the present application investigated the relationship between unstable operation of the load and the voltage waveform of the peaking capacitor Cp. FIG. 9 shows this relationship. It turned out that the waveform from charging to discharging (period t0–t2) is unrelated to the phenomenon in which output energy becomes unstable, but the unstable load phenomenon occurs depending on the waveform from after discharging (time t2) to the voltage recovery (time t4).

Waveforms for which the unstable load phenomenon does not occur during the voltage recovery period, include the following:

Waveform A1 wherein a flat portion in which voltage is not output, is long and the peaking capacitor is not recharged with the reverse polarity;

Waveform A2 wherein the jump to reverse polarity is large, but time period for the jump is short Waveform A3 where in the jump to reverse polarity is small.

In contrast, waveforms where the unstable load phenomenon does occur, includes the waveform B1, wherein the period wherein voltage is not output is short and the jump to reverse polarity is large and for a long period of time.

This shows that the unstable load phenomenon is eliminated by using a circuit structure which suppresses the level and/or time period of the reverse polarity voltage in the recovery voltage waveform of the peaking capacitor.

In order to cause clamping of waveform B1 up to about waveform A3 and attain stable load operation, the resistor R must have a sufficiently low value of resistance. Conversely, ensuring magnetic reset of the pulse transformer PT depends on operation repetition frequency and also requires the generation of several to several tens of volts across the resistor R, which requires that the value of resistance of the resistor R be a large value.

Specifically, the quantity of the current flowing in the resistor R is the turns-ratio of the transformer coil multiplied by the current flowing in the reset coil of the pulse transformer PT. Because the turns-ratio of the secondary coil with respect to the reset coil is generally large, it is necessary for the resistor R to have a large value of resistance in order to ensure resetting.

Consequently, it is very difficult to find a value of resistance of the resistor R which is satisfactory for both the stable operation of the load and the certain magnetic reset of the pulse transformer.

According to this embodiment in which clamp voltage is generated by the Zener diode ZD, it is possible to generate the desired clamp voltage independently from the current flowing in the diode D and Zener diode ZD and therefore ensure magnetic reset of the pulse transformer while attaining stable load operation.

Next, the configuration of the clamp circuit comprising the serial connection of the diode D and Zener diode ZD is explained.

Supposing a configuration in which the serial connection of the diode D and Zener diode ZD is provided ahead of the magnetic pulse compressor circuits. In order to transfer the reverse polarity voltage of the peaking capacitor Cp through the saturable reactor SI2 to the capacitor C2 in this configuration, the saturable reactor SI2 must move from an unsaturated state into a saturated state. This movement of state involves a time delay. Because of this time delay, it is difficult to completely suppress the voltage of the peaking capacitor Cp to a particular level.

Consequently, as in the present embodiment, the diode circuit comprising the serial connection of the diode D and Zener diode ZD is preferably provided at an output terminal of the final magnetic pulse compressor circuit 32, to form a parallel connection with the peaking capacitor Cp.

As described above, in the embodiment shown in FIG. 7, the diode circuit for preventing the peaking capacitor Cp from being recharged with the reverse polarity after it is charged during the discharge recovery of the main discharge electrodes of the load, is provided parallel with the peaking capacitor Cp. Because the Zener diode generates the clamp voltage necessary for magnetic reset of the saturable reactor of the magnetic pulse compressor circuit, the apparatus in the present embodiment can eliminate the unstable load phenomenon due to the recharging of the peaking capacitor, while ensuring magnetic resetting of the pulse transformer after discharge and preventing saturation and magnetic deflection thereof.

Although, in the aforementioned embodiments, the present invention is applied to a capacitor-transfer type of discharge circuit, the present invention may also be applied to other types of discharge circuits such as the LC inversion circuit type, pulse forming line circuit type, or blumline circuit type.

What is claimed is:

1. A discharge circuit for pulsed laser comprising:
   a power source;
   main discharge electrodes for generating a laser beam;
   a main discharge capacitor charged with electrical charges for generating main discharge between the main discharge electrodes;
   a switching circuit for performing switching operations to charge the main discharge capacitor with electrical charges supplied from the power source in a prescribed repetition cycle; and a circuit element provided parallel to the main discharge capacitor for consuming or grounding the reverse current from the power source caused by overshoot generated directly after the main discharge so as to prevent the reverse current from flowing to the main discharge capacitor.

2. A discharge circuit for pulsed laser comprising:

a power source;

main discharge electrodes for generating a laser beam;

a main discharge capacitor charged with electrical charges for generating main discharge between the main discharge electrodes;

a preionization electrode for preionizing a space between the main discharge electrodes;

a preliminary discharge capacitor charged with electrical charges for generating preliminary discharge at the preionization electrode;

a switching circuit for performing switching operations to charge the main discharge capacitor and preionization capacitor with electrical charges from the power source in a prescribed repetition cycle; and a one-way circuit element provided in a direction opposite to the direction in which a reverse current flows from the power source caused by overshoot generated directly after the main discharge, and serially to the preionization electrode so as to prevent the reverse current from flowing to the preionization electrode.

3. A pulsed power source apparatus comprising:

a pulse generating circuit for generating pulsed current from an initially charged capacitor via a pulse transformer as controlled by a semiconductor switch;

a magnetic pulse compressor circuit for performing magnetic pulse compression on the pulsed current attained on a secondary side of the pulse transformer by means of a magnetic switch operation of a saturable reactor, and supplying the pulsed current thus compressed to a load having main discharge electrodes and a peaking capacitor connected parallel to the main discharge electrodes;

a series circuit of a diode and a Zener diode provided in a parallel connection to the peaking capacitor of the load;

the diode being oriented to prevent the peaking capacitor from being recharged in the opposite polarity after being charged during discharge recovery of the main discharge electrodes; and the Zener diode having Zener voltage for generating clamp voltage to prevent the secondary side of the pulse transformer from entering a short circuit state in response to the application of magnetic reset voltage for putting the pulse transformer in an unsaturated state.

* * * * *